(12) United States Patent
Lu et al.

(10) Patent No.: US 9,691,666 B2
(45) Date of Patent: Jun. 27, 2017

(54) LAYOUT ARCHITECTURE FOR PERFORMANCE IMPROVEMENT

(71) Applicant: Taiwan Semiconductor Manufacturing Company, Ltd., Hsin-Chu (TW)

(72) Inventors: Lee-Chung Lu, Taipei (TW);
Hui-Zhong Zhuang, Kaohsiung (TW);
Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/149,925

(22) Filed: May 9, 2016

(65) Prior Publication Data

US 2016/0254194 A1    Sep. 1, 2016

Related U.S. Application Data

(62) Division of application No. 13/537,804, filed on Jun. 29, 2012, now Pat. No. 9,337,290.

(51) Int. Cl.
| | | |
|---|---|---|
| *H01L 21/82* | (2006.01) | |
| *H01L 21/8234* | (2006.01) | |
| *H01L 29/417* | (2006.01) | |
| *H01L 27/02* | (2006.01) | |
| *H01L 21/768* | (2006.01) | |
| *H01L 29/423* | (2006.01) | |
| *H01L 21/3205* | (2006.01) | |
| *H01L 29/06* | (2006.01) | |
| *H01L 27/32* | (2006.01) | |

(52) U.S. Cl.
CPC ........... *H01L 21/823475* (2013.01); *H01L 21/32055* (2013.01); *H01L 21/76802* (2013.01); *H01L 21/76895* (2013.01); *H01L 21/823418* (2013.01); *H01L 27/0207* (2013.01); *H01L 29/0649* (2013.01); *H01L 29/41725* (2013.01); *H01L 29/41775* (2013.01); *H01L 29/4238* (2013.01); *H01L 27/326* (2013.01)

(58) Field of Classification Search
CPC .......... H01L 21/823475; H01L 27/207; H01L 29/4238; H01L 29/41775; H01L 29/41725; H01L 21/823418; H01L 21/76895
See application file for complete search history.

(56) References Cited

U.S. PATENT DOCUMENTS 7,510,960 B2 * 3/2009 Toomey ............ H01L 21/76813
257/503
2012/0037985 A1    2/2012 Smith

* cited by examiner

*Primary Examiner* — Jose R Diaz
(74) *Attorney, Agent, or Firm* — Slater Matsil, LLP

(57) ABSTRACT

An integrated circuit is provided. The integrated circuit includes a first contact disposed over a first source/drain region, a second contact disposed over a second source/drain region, a polysilicon disposed over a gate, the polysilicon interposed between the first contact and the second contact, a first polysilicon contact bridging the polysilicon and the first contact within an active region, and an output structure electrically coupled to the first polysilicon contact.

20 Claims, 5 Drawing Sheets

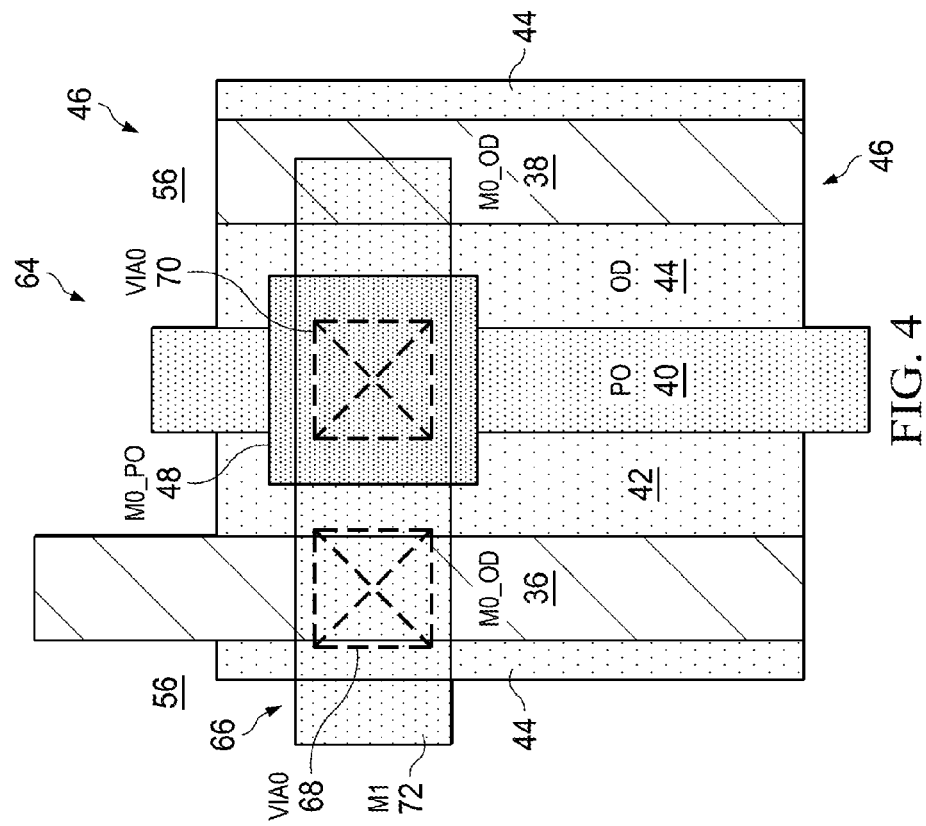
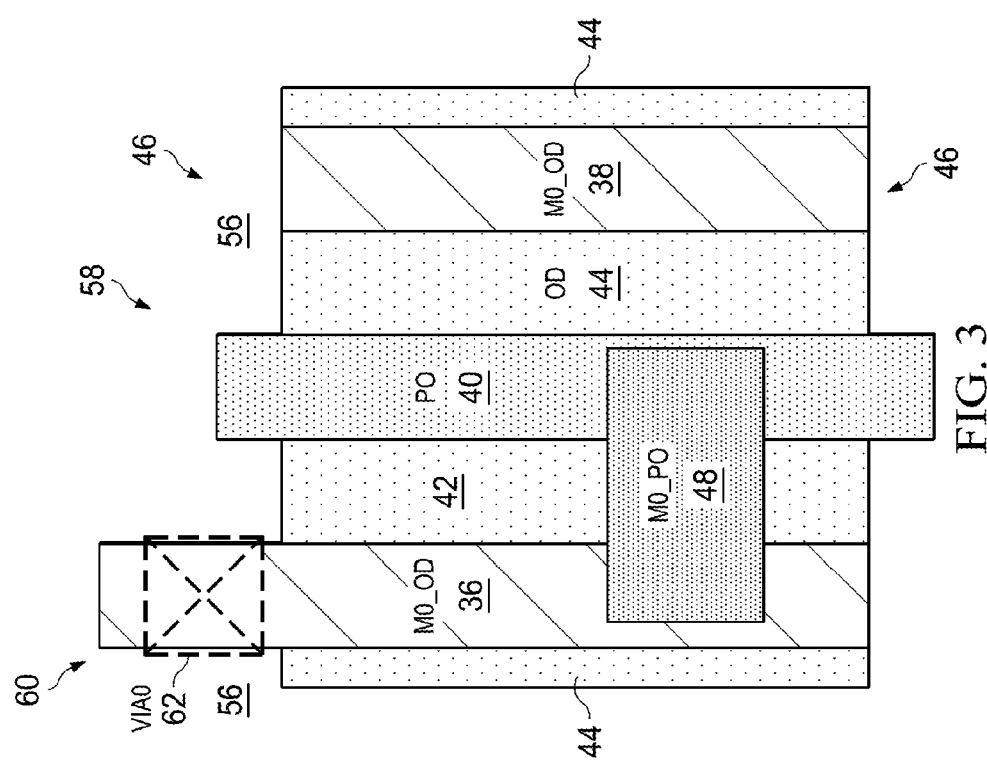

LAYOUT ARCHITECTURE FOR PERFORMANCE IMPROVEMENT

This application is a divisional of U.S. patent application Ser. No. 13/537,804 filed on Jun. 29, 2012, entitled "Layout Architecture for Performance Improvement," which application is hereby incorporated herein by reference in its entirety.

BACKGROUND

In a complementary metal-oxide-semiconductor (CMOS) field effect transistor (FET), or MOSFET, active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. When the gate voltage is less than the threshold voltage, the channel is ideally cut off and no electrons or holes are flowing between the drain and the source.

In some circumstances, the performance of a semiconductor device such as a MOSFET is affected by the size of the transistor. The larger the transistor, the better the performance of the MOSFET. However, increasing the size of the transistor is contrary to demand in the industry for smaller semiconductor devices and results in an area penalty.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3 illustrates a plan view of an embodiment MOSFET having a first polysilicon contact (M0_PO) bridging a polysilicon (PO) and a first metal contact (M0_OD) within an active region (OD);

FIG. 4 illustrates a plan view of an embodiment MOSFET having a first polysilicon contact (M0_PO) bridging a polysilicon (PO) and a first metal contact (M0_OD) within an active region (OD);

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, namely a complementary metal-oxide-semiconductor (CMOS) field effect transistor (FET), or MOSFET. The embodiments of the disclosure may also be applied, however, to a variety of semiconductor devices. Hereinafter, various embodiments will be explained in detail with reference to the accompanying drawings.

Figure 1:
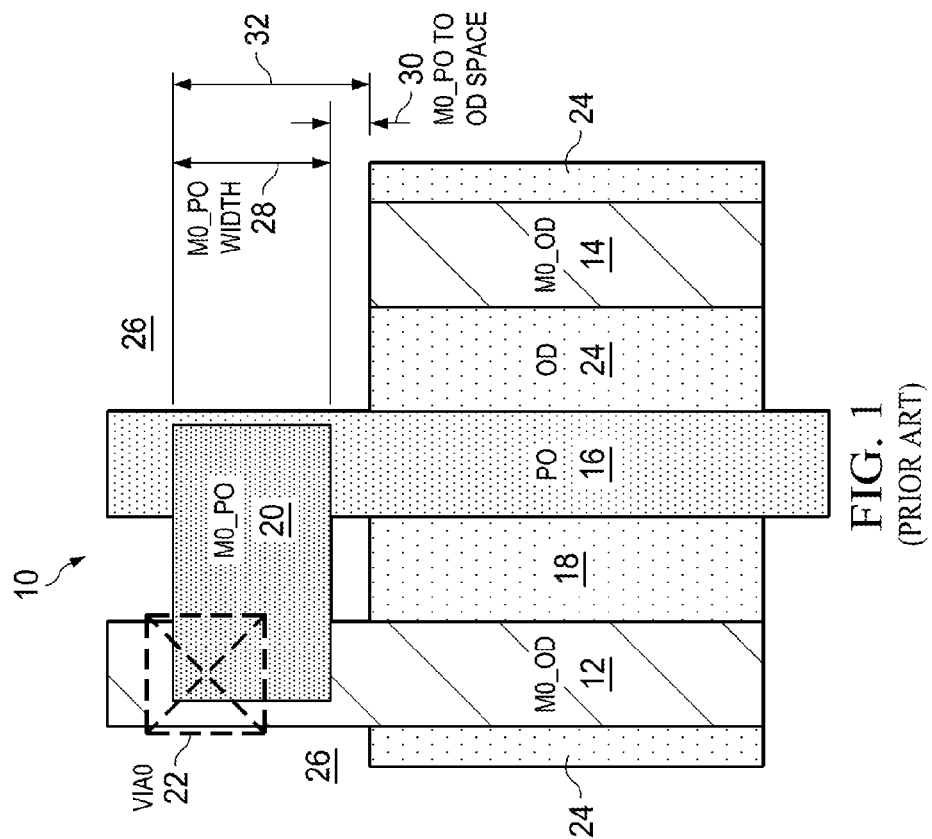
FIG. 1 illustrates a plan view of a conventional MOSFET having a polysilicon contact (M0_PO) bridging a polysilicon (PO) and a first metal contact (M0_OD) outside of an active region (OD)

FIG. 1 illustrates a plan view of a conventional MOSFET 10. The conventional MOSFET 10 includes a first contact (M0_OD) 12 disposed over a first source/drain region (not shown) and a second contact (M0_OD) 14 disposed over a second source/drain region (not shown). For ease of illustration, underlying structures of the conventional MOSFET 10 such as, for example, the source/drain regions, which are typically hidden in plan view, have not been depicted in FIG. 1. In an embodiment, one or both of the first and second contacts 12, 14 is formed from a suitable metal.

Still referring to FIG. 1, the conventional MOSFET 10 also includes a polysilicon (PO) 16 disposed over the gate (not shown). The polysilicon 16 is generally parallel to, and interposed between, the first and second contacts 12, 14. The polysilicon 16 may be spaced apart from the first contact 12 and the second contact 14 by an interlevel dielectric 18.

The polysilicon 16 and the first contact 12 are electrically coupled to each other by a polysilicon contact (M0_PO) 20. In other words, the polysilicon contact 20 bridges the first contact 12 and the polysilicon 16 together. A via (VIA0) 22, which is represented by dashed lines and generally disposed over the first contact 12 and/or the polysilicon contact 20, may be used to electrically couple the polysilicon contact 20, the first contact 12, and the polysilicon 16 to other integrated circuit structures or devices.

Notably, the polysilicon contact 20 of the conventional MOSFET 10 is disposed outside an active region (OD) 24 of the device. As shown in FIG. 1, the polysilicon contact 20 of the conventional MOSFET 10 is disposed within a shallow trench isolation (STI) region 26. It has been discovered that this arrangement of components restricts the size of the active region 24 of the conventional MOSFET device 10. Indeed, a width 28 of the polysilicon contact 20 and a distance 30 that the polysilicon contact 20 is spaced apart from the active region 24 collectively represent portions 32 of the conventional MOSFET 10 that cannot be used to form the active region 24.

Figure 2:
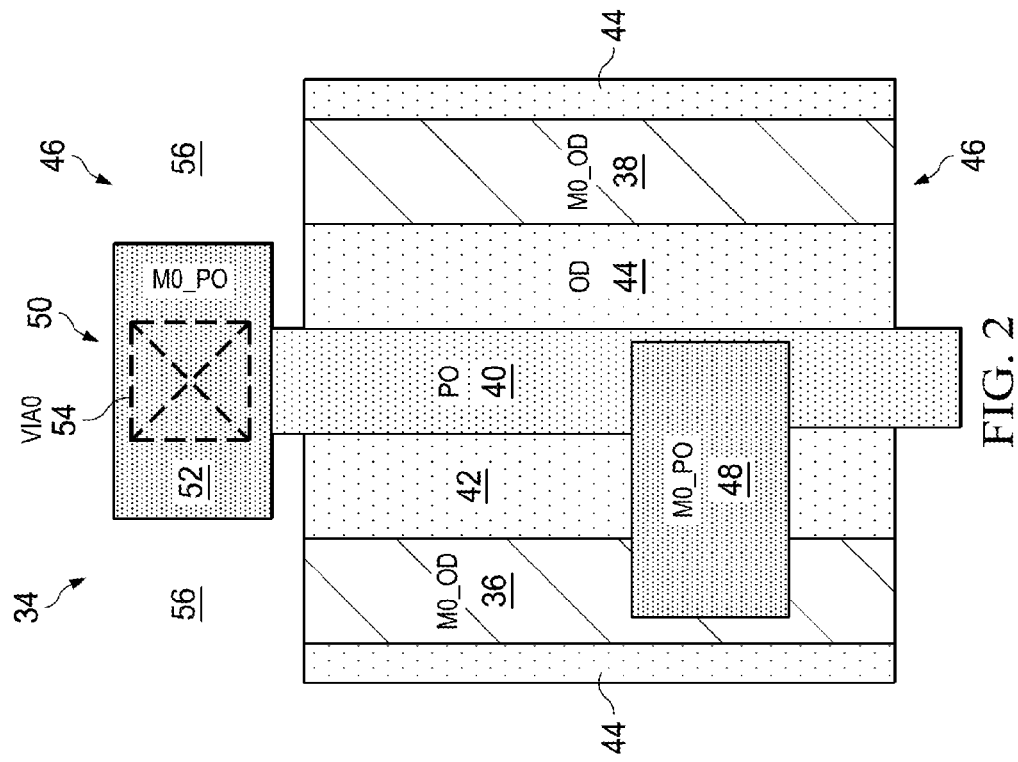
FIG. 2 illustrates a plan view of an embodiment MOSFET having a first polysilicon contact (M0_PO) bridging a polysilicon (PO) and a first metal contact (M0_OD) within an active region (OD)

Referring now to FIG. 2, an embodiment MOSFET 34 is illustrated. As will be more fully explained below, the embodiment MOSFET 34 has an increased transistor size, does not suffer an area penalty, and provides more flexibility for metal routing. Because of the increased transistor size, the performance of the embodiment MOSFET 34 is improved relative to, for example, the conventional MOSFET 10 of FIG. 1. The embodiment MOSFET 34 may be either a PMOS device or an NMOS device.

As shown in FIG. 2, the embodiment MOSFET 34 includes a first contact (M0_OD) 36 disposed over a first source/drain region (not shown) and parallel to a second contact (M0_OD) 38 disposed over a second source/drain region (not shown), each of which may be formed from a suitable metal. For ease of illustration, underlying structures of the embodiment MOSFET 34 such as, for example, the source/drain regions, which are typically hidden in plan view, have not been depicted in FIG. 2. Indeed, because FIG. 2 is a plan view generally depicting the contact layer of the embodiment MOSFET 34, many elements and/or structures are not visible. Regardless, it should be appreciated by those skilled in the art that the embodiment MOSFET 34 includes numerous structures, components, and/or elements beneath and hidden by the contact layer depicted in FIG. 2.

Still referring to FIG. 2, the embodiment MOSFET 34 also includes a polysilicon 40 disposed over a gate (not shown). In an embodiment, the polysilicon 40 is generally parallel to, and interposed between, the first and second contacts 36, 38. In an embodiment, the polysilicon 40 is spaced apart from the first contact 36 and the second contact 38 by an interlevel dielectric 42 or other suitable material. In other words, the first and second contacts 36, 38 and the polysilicon 40 are supported within an active region 44 by the interlevel dielectric 42. In an embodiment, the polysilicon 40 extends beyond the active region 44 at one or both opposing sides 46 of the embodiment MOSFET 34.

The polysilicon 40 and the first contact 36 are electrically coupled to each other by a first polysilicon contact 48. In other words, the first polysilicon contact 48 bridges the first contact 36 and the polysilicon 40 together. It should be appreciated that the first polysilicon contact 48 may bridge the polysilicon 40 and the second contact 38 together in another embodiment.

Still referring to FIG. 2, the embodiment MOSFET 34 includes an output structure 50. The output structure 50 is generally electrically coupled to the first polysilicon contact 48. In an embodiment, the output structure 50 is electrically coupled to the first polysilicon contact 48 through the polysilicon 40. In an embodiment, the output structure 50 is formed from a second polysilicon contact 52 and a via 54 As such, the output structure 50 may be used to electrically couple the first polysilicon contact 48, the first contact 36, and the polysilicon 40 to other integrated circuit structures or devices.

Notably, the first polysilicon contact 48 of the embodiment MOSFET 34 is disposed within the active region (OD) 44 of the device. In other words, as shown in FIG. 2 the first polysilicon contact 48 of the embodiment MOSFET 34 is not disposed within a shall trench isolation (STI) region 56 that generally surrounds, and is immediately adjacent to, the active region 44. Therefore, as shown in FIG. 2, the active region 44 of the embodiment MOSFET 34 is substantially larger than the active region 24 of the conventional MOSFET 10 of FIG. 1. In an embodiment, the active region 44 of the embodiment MOSFET 34 is about thirty percent (30%) larger than the active region 24 of the conventional MOSFET 10 of FIG. 1.

Referring now to FIG. 3, another embodiment MOSFET 58 is illustrated. The embodiment MOSFET 58 of FIG. 3 includes many of the same or similar structures as the embodiment MOSFET 34 of FIG. 2. For the sake of brevity, a discussion of structures with identical reference numbers will not be repeated.

As shown in FIG. 3, the output structure 60 of the embodiment MOSFET 58 is formed from a via 62. The via 62 is electrically coupled to the first polysilicon contact 48 through the first contact 36 disposed over the first source/drain region.

Referring now to FIG. 4, another embodiment MOSFET 64 is illustrated. The embodiment MOSFET 64 of FIG. 4 includes many of the same or similar structures as the embodiment MOSFETs 34, 58 of FIGS. 2-3. For the sake of brevity, a discussion of structures with identical reference numbers will not be repeated.

As shown in FIG. 4, the output structure 66 of the embodiment MOSFET 64 is formed from a first via 68 electrically coupled to the first contact 36 (which is disposed over the first source/drain region), a second via 70 electrically coupled to the polysilicon 40 (which is disposed over the gate), and a top metal 72 electrically coupling the first via 68 and the second via 70 together. As shown, a portion of the top metal 72 in the output structure 66 extends beyond the active region 44. In an embodiment, the top metal 72 is orthogonal to the polysilicon 40 and the first and second contacts 36, 38.

In an embodiment, the first and second contacts 36, 38 fail to extend outside the active region 44 on a side of the embodiment MOSFET proximate the output structure 50 (FIG. 2). In an embodiment, at least one of the first and second contacts 36, 38 and the polysilicon 40 extends outside the active region 44 on the side 46 of the embodiment MOSFET 58 proximate the output structure 60 (FIG. 3). In an embodiment, at least one of the first and second contacts 36, 38 and the polysilicon 40 extends outside the active region 44 (FIG. 4). In an embodiment, the polysilicon 40 extends outside the active region 44 on the side 46 of the embodiment MOSFET 34, 58, 64 opposite the output structure 50, 60, 66 (FIGS. 2-4).

Figure 5:
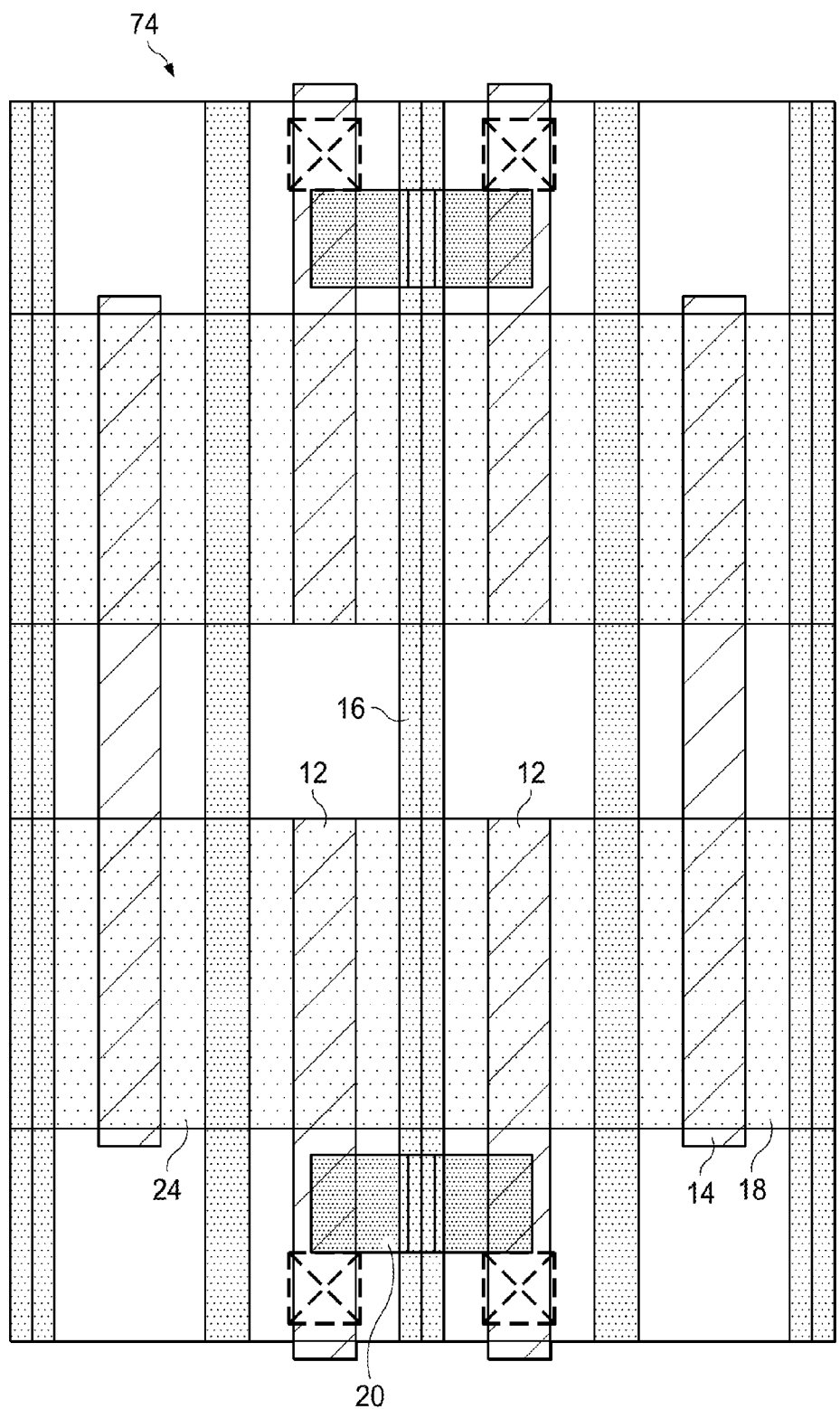
FIG. 5 illustrates an example layout of a conventional MOSFET having a polysilicon contact bridging a polysilicon and a first metal contact outside of an active region.
Figure 6:
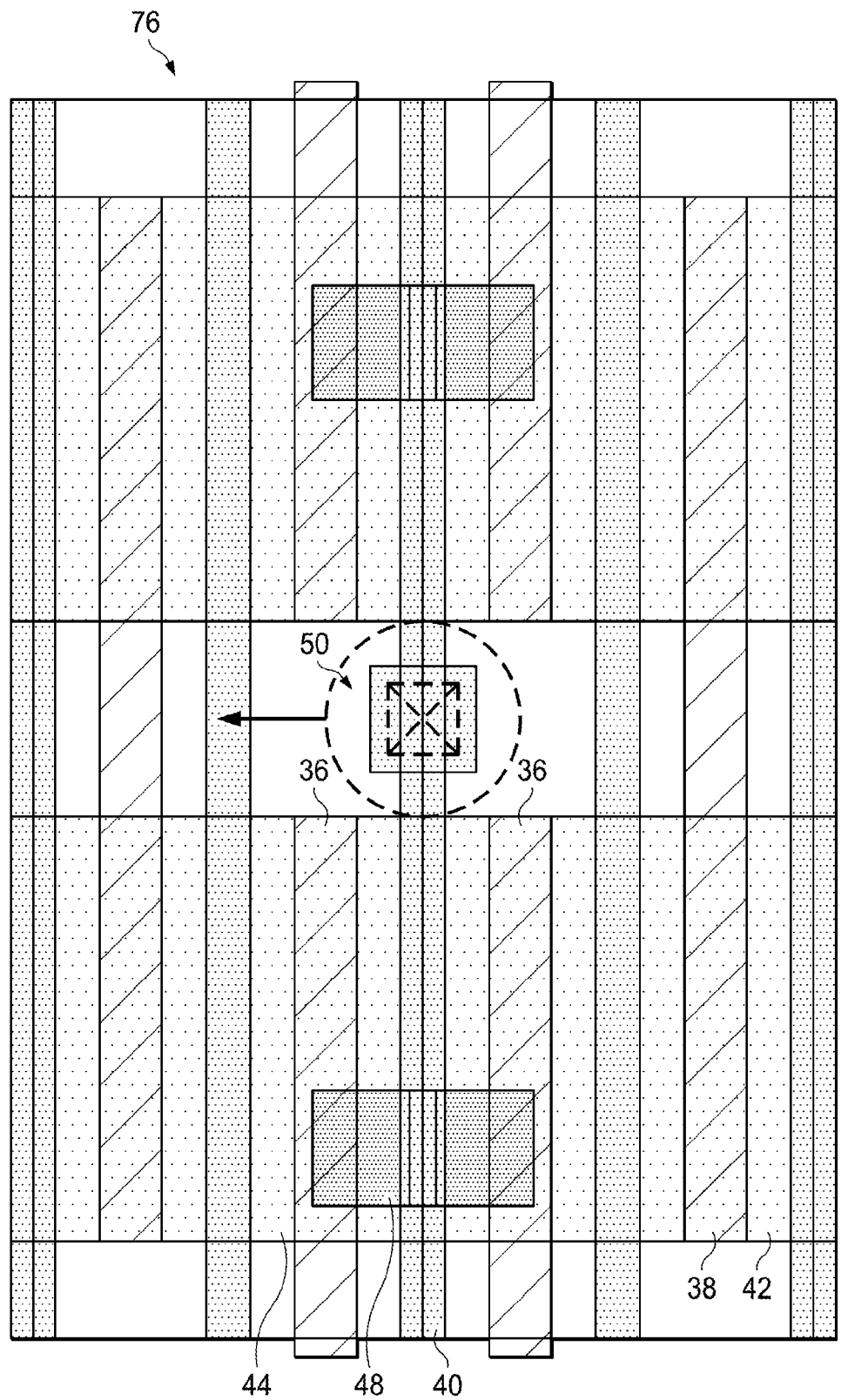
FIG. 6 illustrates a layout of an embodiment MOSFET having a first polysilicon contact bridging a polysilicon and a first metal contact within an active region.
Figure 7:
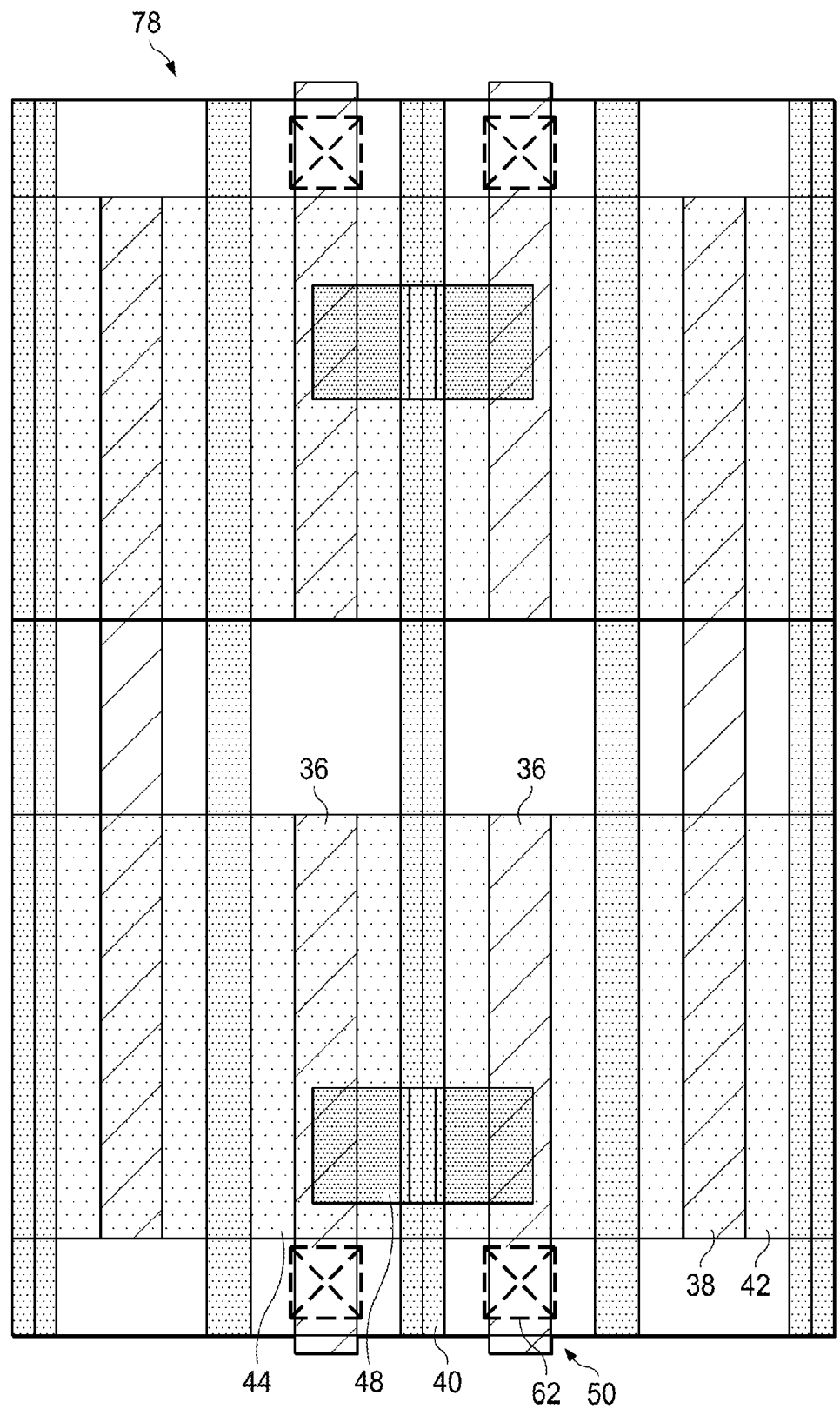
FIG. 7 illustrates a layout of an embodiment MOSFET having a first polysilicon contact bridging a polysilicon and a first metal contact within an active region.

Referring now to FIG. 5, an example layout 74 of the conventional MOSFET 10 of FIG. 1 is illustrated. As shown in FIG. 5, the conventional MOSFET 10 has the polysilicon contact 20 bridging the polysilicon 16 and first contacts 12 outside of the active region 24. In contrast, FIGS. 6-7 illustrate layouts 76, 78 of the embodiment MOSFETs 34, 58 of FIGS. 2-3 having the first polysilicon contact 48 bridging the polysilicon 40 and the first metal contact 36 within the active region 44. As shown, the layouts 76, 78 in FIGS. 6-7 permit the device size of each PMOS or NMOS to be increased by about thirty percent (30%). In addition, the location of the output structure, such as the output structure 50 (FIG. 6) and the output structure 66 (FIG. 7), provides for more flexibility for metal routing.

In an embodiment, an integrated circuit is provided. The integrated circuit includes a first contact disposed over a first source/drain region, a second contact disposed over a second source/drain region, a polysilicon disposed over a gate, the polysilicon interposed between the first contact and the second contact, a first polysilicon contact bridging the polysilicon and the first contact within an active region, and an output structure electrically coupled to the first polysilicon contact.

In an embodiment, an integrated circuit is provided. The integrated circuit includes a first contact disposed over a first source/drain region, a second contact disposed over a second source/drain region, the second contact parallel to the first contact, a polysilicon disposed over a gate, the polysilicon interposed between the first contact and the second contact, a first polysilicon contact bridging the polysilicon and the first contact within an active region, and an output structure electrically coupled to the first polysilicon contact, the output structure at least partially disposed over a shallow trench isolation (STI) region.

In an embodiment, a method of forming an integrated circuit is provided. The method includes forming a first contact over a first source/drain region, forming a second contact over a second source/drain region, forming a polysilicon over a gate, the polysilicon interposed between the first contact and the second contact, bridging the polysilicon and the first contact with a first polysilicon contact disposed within an active region, and electrically coupling the first polysilicon contact to an output structure.

In yet another embodiment, a method of forming an integrated circuit is provided. The method includes forming a first contact disposed over a first source/drain region, forming a second contact disposed over a second source/drain region, the second contact parallel to the first contact, forming a third contact overlying and electrically coupling the first contact and a gate within an active region in a plan view, and forming an output structure electrically coupled to the third contact, the output structure at least partially disposed over a shallow trench isolation (STI) region in a plan view.

In yet another embodiment, a method of forming an integrated circuit is provided. The method includes forming a first contact disposed over a first source/drain region, forming a second contact disposed over a second source/drain region, forming an interconnect extending from the first contact to a gate in a plan view, the interconnect being over an active area in a plan view, the interconnect electrically interposed between the first contact and the gate, and forming an output structure electrically coupled to the interconnect, the output structure at least partially disposed over a shallow trench isolation (STI) region in the plan view.

In yet another embodiment, a method of forming an integrated circuit is provided. The method includes forming a first contact over a first source/drain region, forming a second contact over a second source/drain region, forming a polysilicon bridge electrically coupling the first contact and a gate, the polysilicon bridge being within an active region in a plan view, and forming an output structure, the output structure being electrically coupled to the polysilicon bridge, the output structure being separated from the polysilicon bridge in the plan view.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming an integrated circuit, the method comprising:
   forming a first contact disposed over a first source/drain region;
   forming a second contact disposed over a second source/drain region, the second contact parallel to the first contact;
   forming a third contact overlying and electrically coupling the first contact and a gate within an active region in a plan view, wherein the third contact is polysilicon; and
   forming an output structure electrically coupled to the third contact, the output structure at least partially disposed over a shallow trench isolation (STI) region in a plan view.

2. The method of claim 1, wherein the first contact is electrically interposed between the output structure and the third contact.

3. The method of claim 1, wherein the gate is electrically interposed between the output structure and the third contact.

4. The method of claim 1, wherein forming the output structure comprises forming a polysilicon layer over the gate and forming a via to the polysilicon layer.

5. The method of claim 1, wherein the first and second contacts fail to extend outside the active region on a side proximate the output structure.

6. The method of claim 1, further comprising forming a polysilicon interposed between the third contact and the gate.

7. The method of claim 1, wherein the output structure is disposed completely over the STI region in the plan view.

8. A method of forming an integrated circuit, the method comprising:
   forming a first contact disposed over a first source/drain region;
   forming a second contact disposed over a second source/drain region;
   forming an interconnect extending from the first contact to a gate in a plan view, the interconnect being over an active area in a plan view, the interconnect electrically interposed between the first contact and the gate; and
   forming an output structure electrically coupled to the interconnect, the output structure at least partially disposed over a shallow trench isolation (STI) region in the plan view, wherein forming the output structure comprises forming the output structure to be directly contacting the first contact.

9. The method of claim 8, wherein forming the interconnect comprises forming a polysilicon layer.

10. The method of claim 8, wherein the gate is electrically interposed between the output structure and the interconnect.

11. The method of claim 8, wherein forming the output structure comprises forming a polysilicon layer over the gate and forming a via to the polysilicon layer.

12. The method of claim 8, wherein the output structure does not overlap the first contact and the second contact in the plan view.

13. The method of claim 8, wherein the first and second contacts fail to extend outside the active area on a side proximate the output structure.

14. The method of claim 8, further comprising forming a polysilicon interposed between the interconnect and the gate.

15. The method of claim 8, wherein the output structure is disposed completely over the STI region in the plan view.

16. A method of forming an integrated circuit, the method comprising:
   forming a first contact over a first source/drain region;
   forming a second contact over a second source/drain region;

forming a polysilicon bridge electrically coupling the first contact and a gate, the polysilicon bridge being within an active region in a plan view; and forming an output structure, the output structure being electrically coupled to the polysilicon bridge, the output structure being separated from the polysilicon bridge in the plan view.

17. The method of claim 16, further comprising forming the output structure with a polysilicon contact.

18. The method of claim 16, further comprising forming the output structure with a polysilicon contact disposed within the active region in the plan view.

19. The method of claim 16, wherein the first contact is electrically interposed between the output structure and the polysilicon bridge.

20. The method of claim 16, wherein the gate is electrically interposed between the output structure and the polysilicon bridge.

* * * * *